United States Patent [19]

Maston, III et al.

[11] Patent Number: 5,400,904
[45] Date of Patent: Mar. 28, 1995

[54] TRAY FOR BALL TERMINAL INTEGRATED CIRCUITS

[75] Inventors: Roy E. Maston, III, Amherst; Robert H. Murphy, Merrimack, both of N.H.

[73] Assignee: R. H. Murphy Co., Inc., Amherst, N.H.

[21] Appl. No.: 137,864

[22] Filed: Oct. 15, 1993

[51] Int. Cl.⁶ ............................................. B65D 85/38
[52] U.S. Cl. ................................. 206/329; 206/509; 206/821
[58] Field of Search ............................. 206/328–334, 206/562, 563, 565, 503, 509, 821

[56] References Cited

U.S. PATENT DOCUMENTS

| | | | |
|---|---|---|---|
| 3,615,006 | 10/1971 | Freed | 206/328 |
| 3,892,312 | 7/1975 | Tems | 206/328 |
| 4,556,145 | 12/1985 | Putnam | 206/329 |
| 4,718,548 | 1/1988 | Estrada et al. | 206/328 |
| 4,881,639 | 11/1989 | Matsuoka et al. | 206/328 |
| 5,080,228 | 1/1992 | Maston, III et al. | 206/328 |
| 5,103,976 | 4/1992 | Murphy | 206/328 |

*Primary Examiner*—Jimmy G. Foster
*Attorney, Agent, or Firm*—Pearson & Pearson

[57] ABSTRACT

A tray for the storage and transportation of multiple ball grid array (BGA) integrated circuit components in either of two component orientations. The tray has a lattice framework that defines discrete storage pocket areas. First inwardly facing tabs on the framework define a first support plane for engaging a component is a first orientation of the tray and component. Second inwardly facing tabs on the framework define a second support plane for engaging the component in the second orientation of the tray and component. The framework includes oppositely directed central and corner extensions that stabilize the component in the housing plane in either orientation and a registration structure for allowing the plural trays to be stacked for transport in either orientation.

18 Claims, 4 Drawing Sheets

TRAY FOR BALL TERMINAL INTEGRATED CIRCUITS

BACKGROUND OF THE INVENTION

1. Field of the Invention

This invention generally relates to integrated circuits and more specifically to devices for the storage and transport of such integrated circuits characterized by solder ball terminals.

2. Description of Related Art

The storage and transportation of semiconductor components have become important considerations in the production of electronic assemblies, especially as semiconductor components have matured from inexpensive, elementary circuit elements into expensive, sophisticated, complex circuit components. As these components have grown in complexity, they have become more susceptible to damage from a number of external influences, such as mechanical shock and discharges of accumulated electrostatic charge. Consequently, there have been many changes in the transportation, assembly and testing procedures that electronic assembly production facilities utilize. Such procedures, when properly implemented, now contribute significantly to the success of such electronic assembly facilities.

For example, in certain circumstances it is important to transport a component, such as an integrated circuit, pretest it, and provide ready access to the component for delivery to or insertion into a printed circuit board. "Chip carriers" provide such functions for individual components. "Chip carriers" are special fixtures that house and protect individual components, such as an integrated circuits, from damage due to mechanical shock or electrostatic discharge during processing, production, testing and assembly operations. A chip carrier also can orient an integrated circuit during the production process, assure proper placement and alignment of terminals for testing and for insertion into a printed circuit board.

In other circumstances, there may only be a requirement for the storage and shipment of large numbers of integrated circuits and like components without testing. For example, integrated circuit manufacturers ship such components to customers in bulk quantities. Some customers may desire to move such components in groups or sets directly to a printed circuit board. Other customers may desire to transport or store such components and then transfer the components to chip carriers or the like for further transportation and testing. When this limited requirement exists, it is difficult to justify the costs of purchasing and handling individual chip carriers. Examples of devices that store or carry multiple semiconductor components on a simple device are illustrated in the following U.S. Pat. Nos.:

3,469,686 (1969) Gutsche et al.
3,482,682 (1969) Cronkhite
3,361,253 (1972) Cronkhite
3,946,864 (1976) Hutson
4,057,142 (1977) Lechner et al.

The foregoing references disclose generally devices for storing semiconductor wafers. Such wafers, however, do not have terminals that are normally encountered in finished integrated circuits. These trays are not readily adapted to devices with terminals. However, the following United States Letters Patent disclose devices for the shipment and transportation of integrated circuit components or for circuits utilizing such integrated circuit components:

4,210,243 (1980) McDowell
4,725,918 (1988) Bakker
4,792,042 (1988) Koehn et al.
5,103,976 (1992) Murphy U.S. Pat. No. 4,210,243 to McDowell discloses a tray for holding integrated circuit packages of the transistor outline type. This tray has a top plate with a plurality of funnel shaped openings each having a cylindrical bottom portion for receiving a case. The top and bottom edges of the trays are dimensioned so that the top of a first tray nests inside the bottom of a second tray. When the nested trays are turned over, packages and openings in the first tray sit with the flat portions of their leads on the bottom of the second tray. A rim limits transverse movement of the packages set on the plate when the tray is shaken to cause them to fall into associated openings.

U.S. Pat. No. 4,725,918 to Bakker discloses a box for storing electronic devices apparently including integrated circuits. The box includes a material that minimizes electrostatic accumulation and resultant discharges that could otherwise damage the electronic device.

U.S. Pat. No. 4,792,042 to Koehn et al. discloses a chip carrier for individual electronic circuits. It is possible to stack these chip carriers for shipment in bulk, albeit, in a single package.

Each of the foregoing McDowell, Bakker and Koehn et al. patents describes a device for use with a component of a single size or limited range of sizes. The Murphy patent discloses a tray for the transportation and storage of pin grid array integrated circuit components. A pin grid array (PGA) integrated circuit component typically has a thin planar housing of a ceramic or other material for containing a semiconductor substrate and related circuitry. Terminal pins extend perpendicularly to one planar surface of the housing. The terminal pins define an array or matrix of columns and rows with an industry-standard spacing. Currently the spacing is 0.1 inch so the terminal density is about 100 terminals per square inch. PGA integrated circuit components come in myriad sizes that are defined alternatively by the size of the housing (from a 1 inch square to a 2.5 inch square) or by the size of the matrix (from a 9×9 terminal pin matrix to a 25×25 terminal pin matrix).

The Murphy patent discloses stackable trays for carrying multiple PGA integrated circuit components. Each tray has a lattice framework that defines discrete storage pocket areas. Each storage pocket area comprises a base support that spans portions of the framework and includes upstanding ribs that engage the integrated circuit component. The locus of the upstanding ribs of a given set constitutes a rectangle or square that is concentric with and spaced from the locus of other sets of upstanding ribs. Depending terminal pins from the housing lie between individual ones of the upstanding ribs.

These trays have proven to accommodate various characteristics inherent in such components and to satisfy other requirements imposed by manufacturing processes. For example, this tray provides a direct, repeatable correlation between the tray and the terminal pins. It also protects the terminal pins from damage due to mechanical shock during transport and prevents the accumulation of an electrostatic charge on the PGA integrated circuit component to avoid a potential discharge and damage.

Integrated circuit manufacturers now produce an integrated circuit package called a ball grid array (BGA) integrated circuit. BGA integrated circuits are characterized by a thin planar housing and a plurality of external terminals on one side of that housing. Each external terminal comprises a small solder ball. Like prior art PGA integrated circuit packages, the solder ball terminals in a BGA integrated circuit package can be arranged in a two-dimensional array. However, the terminal density in a BGA integrated circuit package is many times (up to 7 or more times) greater than attained with PGA integrated circuit packages.

The manufacturers of BGA integrated circuit packages and their customers who assemble these packages onto circuit boards have evolved a series of handling requirements that are more restrictive than those associated with PGA integrated circuit packages. For example, solder ball terminals are more susceptible to physical damage than the terminal pins in PGA integrated circuit packages. Consequently both manufacturers and customers want a common component tray that protects the integrated circuit from physical and electrical damage. Both want a tray that provides repeatable positioning of the BGA integrated circuit package in the tray to enhance automated assembly techniques. Both want a tray that will store multiple BGA integrated circuit packages and that will stack with other trays to facilitate bulk transport and storage.

However, the manufacturers and customers have a set of apparently antithetical requirements that must be met without sacrificing any of the common requirements. Specifically, manufacturers want to transport BGA integrated circuit packages in a "terminals up" configuration in which the planar housing is substantially horizontal and the solder ball terminals are "on top" of the housing. This "terminals up" position facilitates the inspection and testing of the BGA integrated circuit package by the manufacturer prior to shipment. Moreover, some customers will desire to work with the components in this "terminals up" orientation for initial inspection and preliminary testing. However, most users will want to "flip" the component to a "terminals down" position for robitics to pick and place when being joined to a circuit board. In a "terminals down" position the planar housing is essentially horizontal and the terminals are on the "bottom" of the planar housing.

None of the prior art storage trays is capable of providing all these requirements. In each it would be necessary to design separate trays for each of the "terminals up" and "terminals down" orientations and to establish some methodology for transferring the BGA integrated circuit packages individually in one orientation in one tray to the second orientation in the other tray. Such a methodology is not be acceptable because it introduces extra manufacturing time and costs and because any such handling introduces an increased risk of integrated circuit component damage.

SUMMARY

Therefore it is an object of this invention to provide an economical tray for the transportation and storage of electronic components, particularly ball grid array integrated circuit components, with the component in either of two orientations.

Another object of this invention is to provide a tray for storing and transporting electronic components, particularly ball grid array integrated circuit components, that accurately positions the components and the terminals on those components in either of two orientations.

Another object of this invention is to provide a tray for storing and transporting electronic components, particularly ball grid array integrated circuit components, that protects the terminals emanating from such components from damage due to contact with the tray or other devices in either of two orientations of the component.

Still another object of this invention is to provide a tray for storing and transporting ball grid array integrated circuit components with solder terminals on one side of a planar housing that stabilizes the position of such components both when the terminals are oriented above the housing and below the housing.

Yet another object of this invention is to provide stackable trays for storing and transporting ball grid array integrated circuit components in which each tray can carry the components in either of two orientations.

Yet still another object of this invention is to provide a tray system with identical stackable trays for storing and transporting ball grid array integrated circuit components that facilitates both manual and automated handling techniques by allowing the stacked tray and components stored therein to be flipped between two orientations.

In accordance with this invention, a tray for storing and transporting integrated circuit components characterized by a thin planar housing and plurality of terminals on one side of the housing comprises a framework that defines a storage pocket area for the component. A first support carried by the framework defines a first support plane for engaging the one side of the integrated circuit component. A second support carried by said framework defines a second support plane that is parallel to the first support plane for engaging the other side of an integrated circuit component. This structure enables the tray to store the integrated circuit component in a first orientation with the first support plane above the second support plane and a second orientation with the first support plane below the second support plane. The framework stabilizes the position of the integrated circuit component in both orientations.

In accordance with another aspect of this invention, a tray system for storing a plurality ball grid array integrated circuit components includes first and second trays. Each integrated circuit component has a planar housing and an array of ball terminals located on one side of the housing. Each of the first and second trays includes a framework and first and second sets of supports. The framework defines a storage pocket area for each integrated circuit component and locates each integrated circuit component at and stabilizes the position of the integrated circuit component within a corresponding storage pocket area. The first support set carried by the framework in each said storage pocket area defines a first support plane engages the one side of the integrated circuit component in that storage pocket area. The second support set carried by the framework in each said storage pocket area defines a second support plane that is parallel to and spaced from the first support plane and engages the other side of the integrated circuit component. Complementary structures on each tray enable the first and second trays to be stacked and capture the integrated circuit component therebetween.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
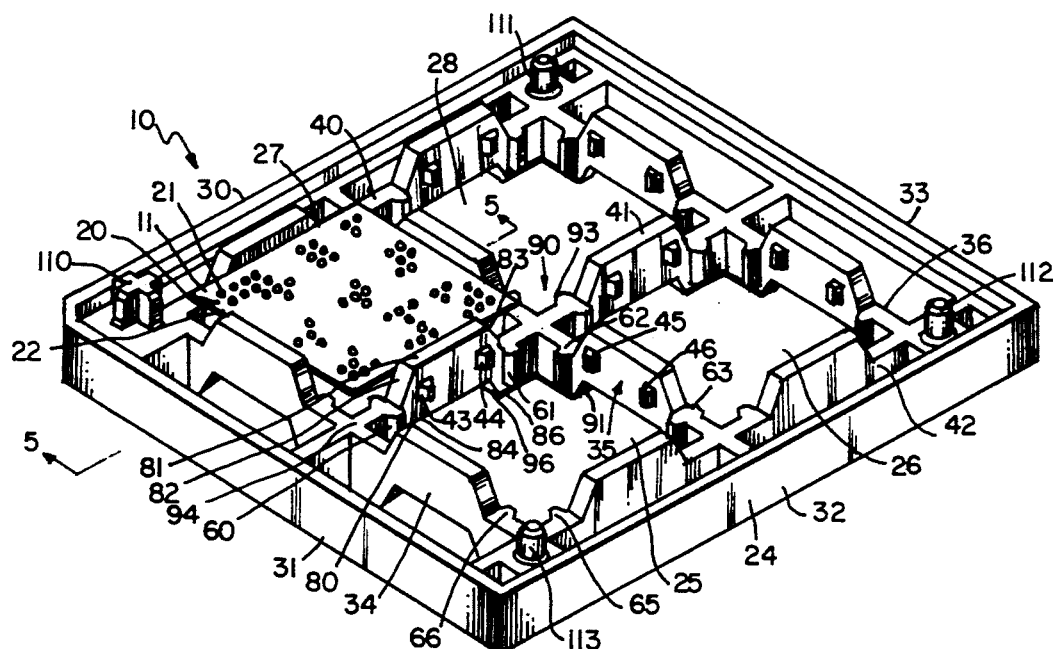
FIG. 1 is a perspective view of a tray that is constructed in accordance with this invention for storing and transporting electronic components in a first orientation.
Figure 2:
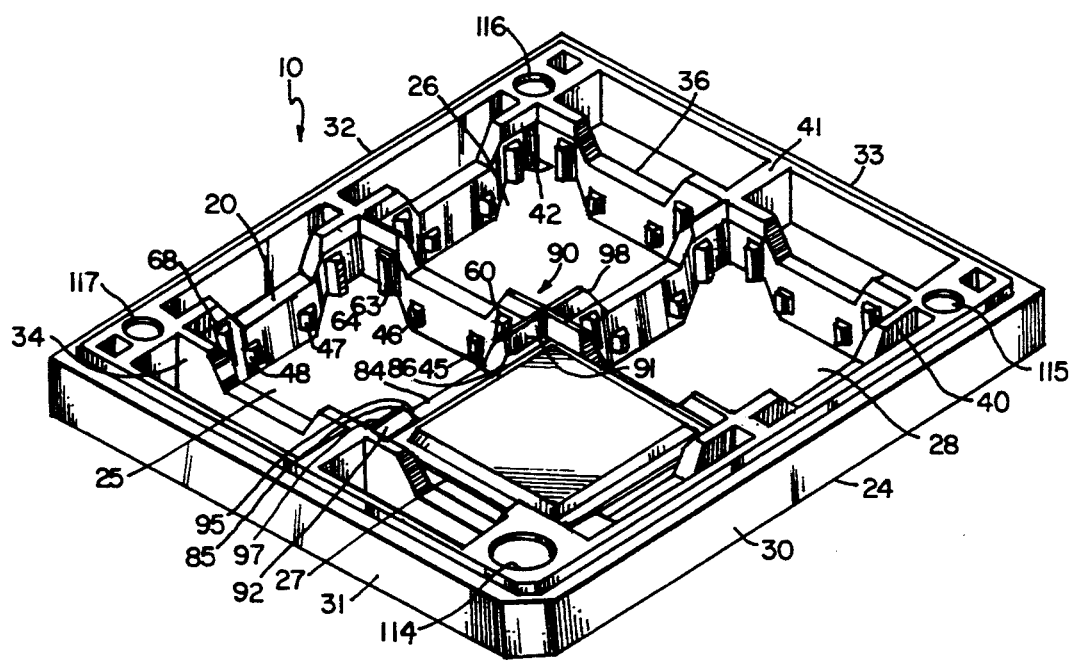
FIG. 2 is a perspective view of the tray in FIG. 1 in a second orientation.
Figure 4:
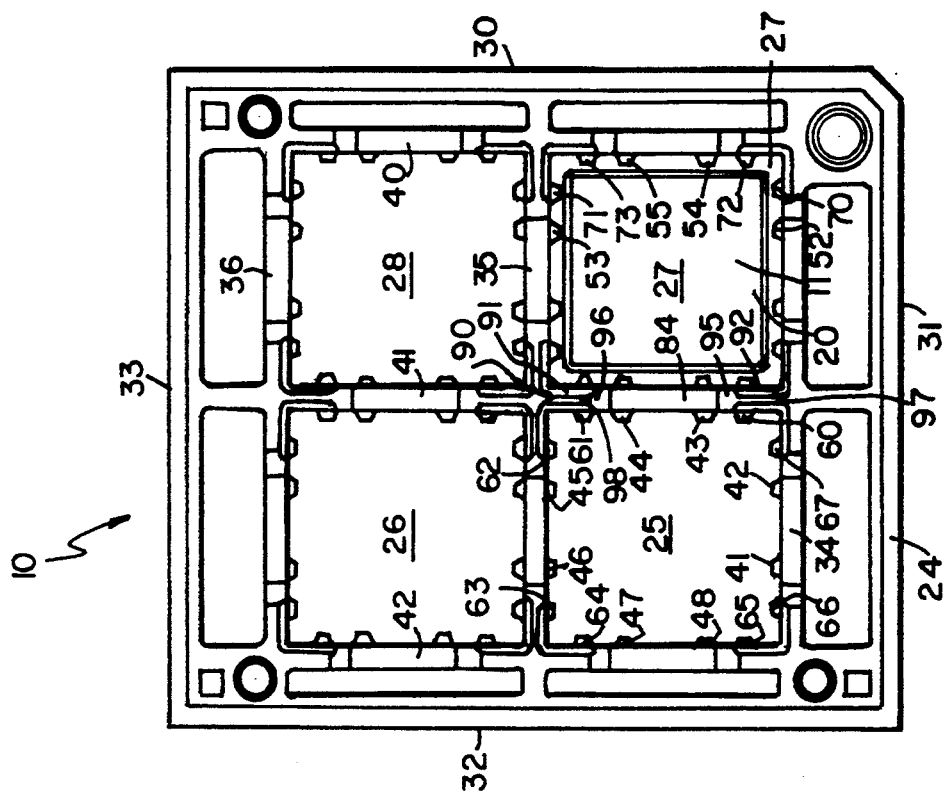
FIG. 4 is a bottom view of the tray.
Figure 3:
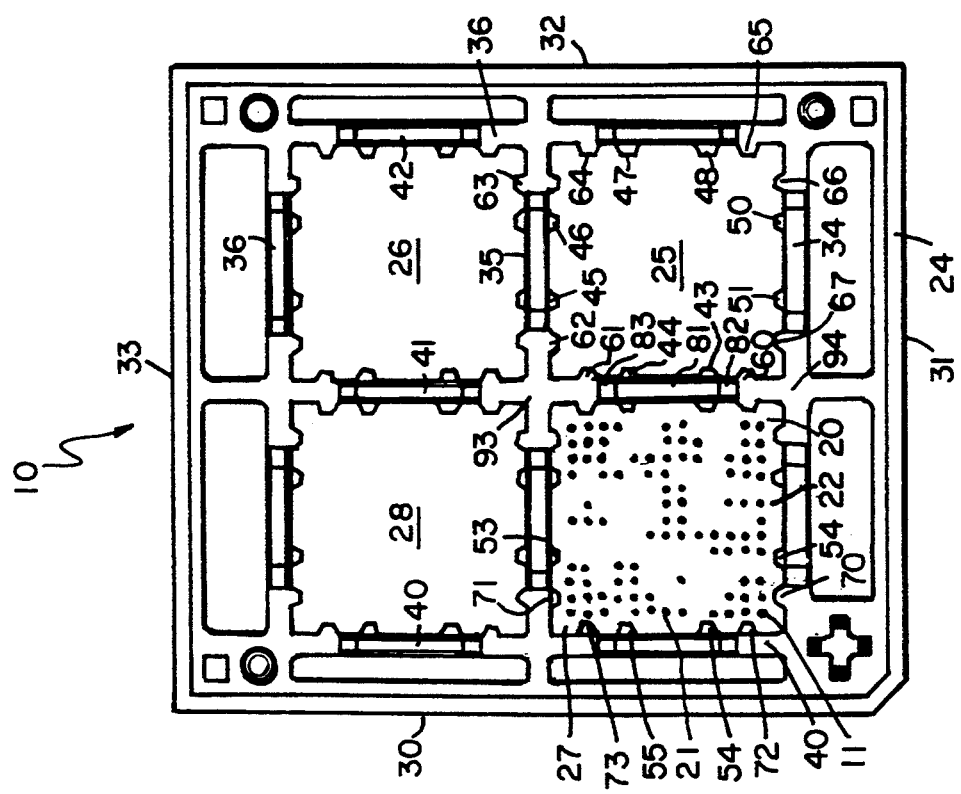
FIG. 3 is a top view of the tray.
Figure 5:
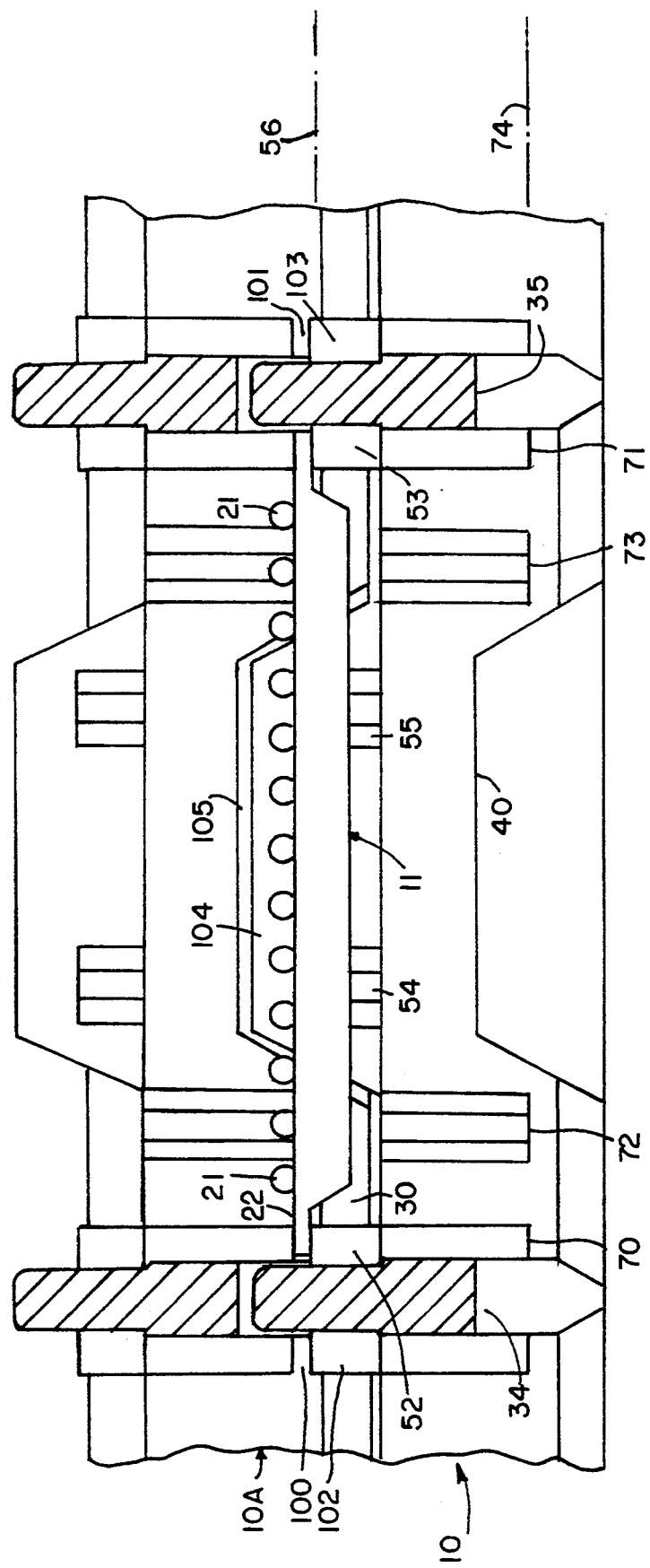
FIG. 5 is an enlarged cross-sectional view of a portion of a pair of stacked trays taken generally along lines 5—5 of FIG. 1 in a first orientation.
Figure 6:
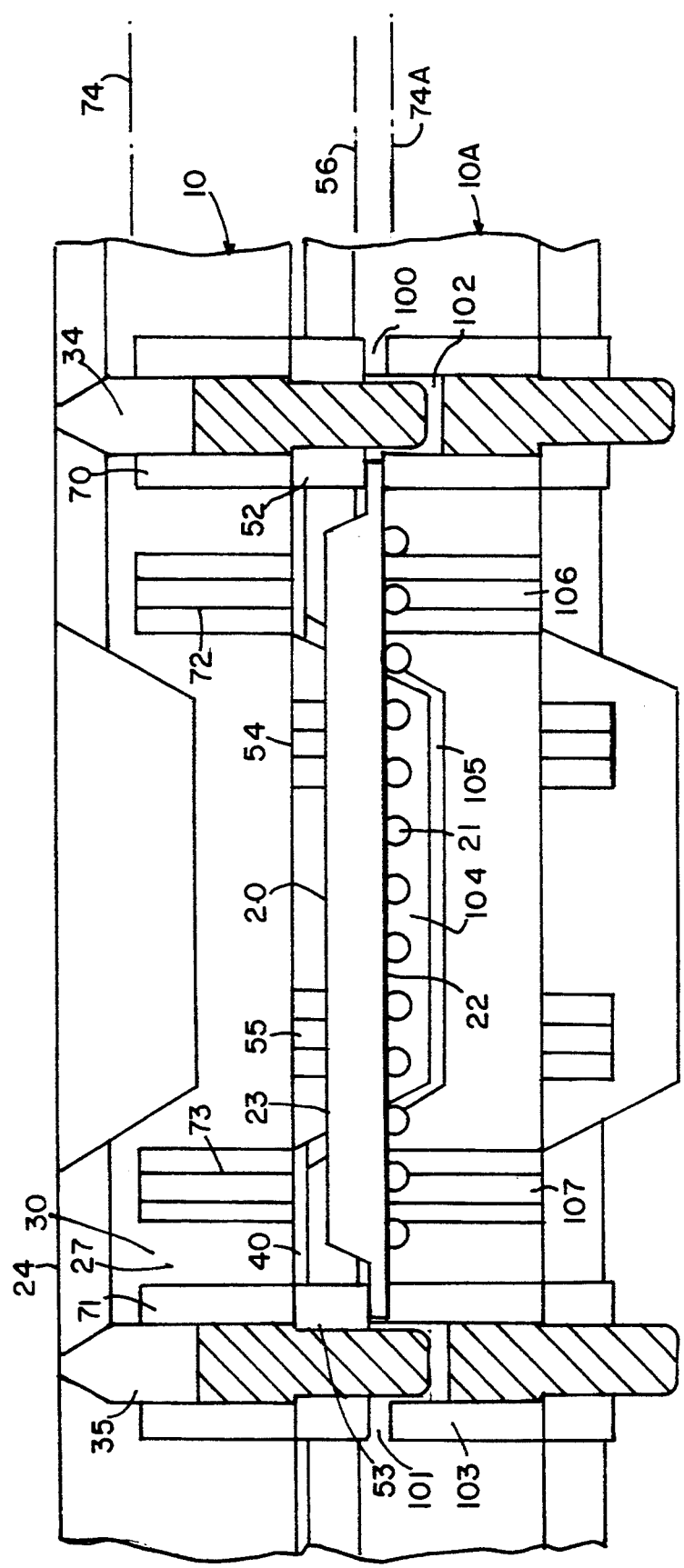
FIG. 6 is an enlarged cross-sectional view of the pair of trays in FIG. 5 in a second orientation.

A tray system for storing and transporting integrated circuit components or the like constructed in accordance with this invention comprises a tray 10 as shown in FIGS. 1 through 4 that can be stacked with one or more additional trays, such as a second tray 10A in FIGS. 5 and 6. In this particular embodiment, the tray 10 carries a number of ball grid array ("BGA") integrated circuit components at discrete locations, or storage pocket areas, in the tray 10. By way of example, each of FIGS. 1 through 6 depicts a BGA component 11 with a thin, planar housing 20 and a plurality of solder ball terminals 21 formed on one planar surface 22 of the housing 20 as shown in FIGS. 1, 3 and 5. In this orientation, the terminals 21 lie "on top" of the housing 20 and arranged in a two-dimensional matrix. This is a "terminals up" orientation. In FIGS. 2, 4 and 6 the integrated circuit terminals lie below the housing 20 in a "terminals down" orientation, with only the other surface 23 of the housing visible.

The tray 10 is an integrally molded device, typically of a conductive plastic. The conductive plastic may comprise any of a wide variety of easily molded, conductive and thermally and dimensionally stable materials. A conductor-filled, polyether sulfone material is preferred. Other materials include carbon- or aluminum-filled polyetherimides, polyaeryl sulfones and polyesters.

The tray 10 in FIGS. 1 through 4 is molded in a lattice-like framework 24 that segregates the tray 10 into an arbitrary number of discrete storage pocket areas. In the particular embodiment of FIG. 1, the framework comprises four storage pocket areas 25, 26, 27, and 28 that are arranged in two columns and two rows. Specifically, the tray 10 includes outer peripheral beams 30, 31, 32 and 33 that form the periphery of the tray 10. A series of intersecting walls define the storage pocket areas and include a first set of walls 34, 35 and 36 that are parallel to the beams 30 and 32 and a second set of spaced parallel walls 40, 41 and 42 between the beams 31 and 33. The walls 34, 35 and 36 intersect the walls 40, 41 and 42. Collectively these walls form the peripheries of the various pocket storage areas. More specifically, portions of walls 34, 35, 41 and 42 form the storage pocket area 25; walls 35, 36, 41 and 42 form storage pocket area 26; walls 35, 36, 40, and 41 form storage pocket area 27; and walls 35, 36, 40 and 41 form storage pocket area 28.

Each of the storage pocket areas 25 through 28 has identical construction, so only storage pocket area 25 is described in detail. Looking at storage pocket area 25, particularly in FIGS. 1 and 3, the portion of the walls 34, 35, 41 and 42 that bound the storage pocket area 25 include a number of inwardly projecting tabs. Specifically, tabs 43 and 44 extend from the portion of wall 41; tabs 45 and 46, from a portion of wall 35; tabs 47 and 48, from a portion of wall 42; and tabs 50 and 51, from a portion of wall 34. Each of these tabs 43 through 48, 50 and 51 forms a coplanar surface that receive one side of the integrated circuit 11 when the integrated circuit 11 is inserted into the storage pocket areas 25 through 28 from above the tray 10 in the orientation shown in FIGS. 1 and 3. In FIG. 5 (on the top of the tabs in the orientation scheme in FIG. 1), the top edge surfaces on a corresponding tab 52 on wall 34, tab 53 on wall 35 and tabs 54 and 55 on wall 40 form a first support plane 56. More specifically, in the position shown in FIG. 1, tabs in the storage pocket area 25 corresponding to tabs 43 through 48, 50 and 51, engage the other surface 23 of the integrated circuit 11 thereby to support the integrated circuit 11 in a terminals up position.

Each of the walls includes additional tabs that are formed between individual ones of the first tabs and adjacent intersections of walls. Again as shown in FIGS. 1 and 3, the portion of the wall surface forming storage pocket area 25 carries inwardly extending tabs 60 and 61 while portions of the wall 35, 41 and 34 carry, respectively, tabs 62 and 63, tabs 64 and 65 and tabs 66 and 67. Edges of corresponding tabs 70 on wall 34, 71 on wall 35 and tabs 72 and 73 on wall 40 form a second support plane 74 that, as shown in FIG. 6, engages the one planar surface 22 of the integrated circuit 11 to support the integrated circuit 11 in a terminals down position when the integrated circuit 11 is inserted in a storage pocket areas 25 through 28 from above the tray 10 in the orientation shown in FIGS. 2 and 6. These edges are the top tab edges in FIG. 6 and the bottom tab edges in FIG. 5.

Each wall portion around each storage pocket area additionally includes structures for restraining any motion of the integrated circuit 11 in a direction that is parallel to either of the first or second support planes 56 and 74, shown in FIGS. 5 and 6. The wall 41 between the storage pocket areas 25 and 27 has a central body portion 80 that extends between the walls 34 and 35. A central extension in the form of a tongue 81 carries the tabs 43 and 45 that extend into the storage pocket area 25 and corresponding tabs that extend into the storage pocket area 27. The tongue 81 extends above the central portion 80 in the orientation of FIG. 1 and includes chamfered or angled surface 82 and 83 that form a transition between the upper edge of the central portion 80 and the free edge of the tongue 81. A recess 84 located below the central portion 80 has chamfered surfaces 85 and 86 and corresponds in form to the tongue 81.

Each of the wall intersections, such as the intersection 90 formed by walls 35 and 41, has a corner extension structure that extends along each wall portion into each of the adjacent storage pocket areas. In the storage pocket area 25, for example, a portion of a corner extension 92 extends downwardly or oppositely from the tongue 81 at the intersection 90. A similar corner extension 92 extends along a portion of the wall 41 from the intersection of the walls 41 and 34. Each of these corner extensions mates with a corresponding recess 93 or 94 as shown in FIGS. 1 and 3 formed by chamfered surfaces 82 and 83 thereby to facilitate the interengagement of corner extensions and tongue portions. In addition each of the corner extensions, such as corner extensions 91 and 92, terminate with chamfered free edges 97 and 98 respectively. The edges facilitate the placement of components on the tray in a terminals down orientation.

As shown in FIG. 5, the edges of the housing 11 rest on the first support plane 56 defined by edges of the central tabs 52, 53, 54 and 55. Corner extensions 100 and 101 on the tray 10A interengage recesses 102 and 103 on the tray 10. These corner extensions 100 and 101 extend vertically down past the integrated circuit in the orientation shown in FIG. 5. A central extension or tongue 104, corresponding to the central extension 81, extends upwardly into a recess 105 formed in the tray 10A that corresponds to the recess 84 shown in FIGS. 1 and 3. The tongue 105 also extends vertically upwardly past the integrated circuit 11. Consequently, each of the wall portions surrounding a particular storage pocket area includes portions of the walls of the adjacent stacked trays 10 and 10A, and they form an essentially continuous wall surface. Each of these walls is identical and positioned proximally the edges of the integrated circuit 11 thereby to capture the integrated circuit 11 in a storage pocket area and limit any motion of the integrated circuit 11 parallel to a support plane (i.e., horizontally in the orientation shown in FIGS. 5 and 6).

FIG. 6 depicts the structure of the stacked trays of FIG. 5 after they have been flipped to orient the integrated circuit 11 in a terminals down orientation. In this position edges of the tabs, such as tabs 106 and 107 in FIG. 10A, that correspond to tabs 72 and 73 in tray 10, support the housing 11 in a second support plane 74A corresponding to the support plane 74. The support plane 56 and 74A are spaced by an amount corresponding to the thickness of the of the integrated circuit housing 20.

In accordance with another aspect of this invention, FIGS. 1 and 2, the beams 30 through 33 include bosses 110, 111, 112 and 113 on one surface of the tray 10 and aligned receptacles 114, 115, 116 and 117 formed in the opposite side of the tray 10. Certain of the bosses can have differing shapes to assure registration and appropriate alignment of adjacent trays. In FIGS. 1 and 2, for example, the boss 110 is formed as a cruciform while bosses 111 through 113 are cylindrical and the receptacle 114 is larger than the receptacles 115 through 117. This assures that adjacent trays can only stack with the receptacle 114 and mating with the boss 110. Moreover, the extensions of the tongues, such as tongue 104 and the corner extensions, such as corner extensions 100 and 101 past the integrated circuit assure that improperly oriented trays will not engage and damage the terminals 21 on the integrated circuit 11.

If the trays are stacked as shown in FIG. 5 and the upper tray 10A is then removed, the lower tray extends the terminals 21 as shown in FIG. 1. In this orientation the terminals are accessible for inspection and tests. The central tongues such as the tongue 81, engage each of the edges of the integrated circuit 11 thereby to stabilize its position in a horizontal plane. If the tray 10A is stacked on top of the tray 10 as shown in FIG. 5, the stacked trays can then be turned over to the orientation shown in FIG. 6. During this process, the various tabs in both trays coact to stabilize the position of the integrated circuit relative to the two trays during tray rotation. If the upper tray, now the tray 10, is removed, the tray 10A holds the integrated circuit 11 in a terminals down position as is also shown in FIG. 2. In this orientation the corner extensions stabilize the position of the integrated circuit 11 within the storage pocket area 25.

Thus, it will now be apparent that the tray 10 constructed in accordance with this invention satisfies each of the objects of this invention. The tray is directly adapted for use with ball grid array integrated circuit components. A single tray can orient the components in a "terminals up" or "terminals down" position. Wall portions around each BGA component accurately position each integrated circuit to facilitate pick and place operations. Moreover, wall portions form pockets and protect the integrated circuits from physical damage. Yet, all the terminals are readily accessible for inspection an test in a "terminals up" orientation.

This invention has been disclosed in terms of certain embodiments. It will be apparent that many modifications can be made to the disclosed apparatus without departing from the invention. For example, the specifically disclosed tray 10 uses a plurality of inwardly extending tabs to define each of two support planes. Other structures could be substituted for such tabs and serve to establish one or both of these support planes. Therefore, it is the intent of the appended claims to cover all such variations and modifications as come within the true spirit and scope of this invention.

What is claimed as new and desired to be secured by Letters Patent of the United States is:

1. A tray for storing an integrated circuit component having a planar housing and an array of terminals located on one side of the housing, said tray comprising:
   A. framework means for defining a storage pocket area and for locating the integrated circuit component at and stabilizing the position of the integrated circuit component housing in a plane transverse to said framework means, said storage pocket area being accessible from first and second opposite sides of said framework means,
   B. first support means carried by said framework means for defining a first support plane that is transverse to said framework means for engaging the one side of the integrated circuit component when the integrated circuit component is inserted into said storage pocket area from said first side of said framework means, and
   C. second support means carried by said framework means for defining a second support plane that is parallel to and spaced from said first support plane for engaging the other side of an integrated circuit component when the integrated circuit component is inserted into said storage pocket area from said second side of said framework means whereby said tray stores the integrated circuit component in a first orientation when said tray is in a first, substantially horizontal position with the first support plane above the second support plane and stores the integrated circuit component in a second orientation when said tray is in a second, substantially horizontal position with the first plane below the second plane and said framework means stabilizes the position of the integrated circuit component in said storage pocket area tray in both the first and second orientations.

2. A tray for storing an integrated circuit component as recited in claim 1 wherein said framework means includes a plurality of intersecting wall means for defining the limits of a storage pocket area proximate the edges of said integrated circuit component housing and wherein each of said wall means includes a central portion, corner extensions at each intersection of said wall means extending perpendicularly to one side of said first and second support planes and central extensions located centrally of each said wall means and extending perpendicularly to other side of said first and second support planes plane whereby said central extensions and said corner extensions stabilize the integrated circuit component when the tray is in the first and second orientations, respectively.

3. A tray for an integrated circuit component as recited in claim 2 wherein each of said central and corner extensions have chamfered edges intersecting said central portion.

4. A tray for an integrated circuit component as recited in claim 2 wherein at least one of said first and second support means comprises a plurality of discrete, spaced tabs carried by said wall means and extending into the storage pocket area.

5. A tray for an integrated circuit component as recited in claim 2 wherein each of said first and second support means comprises a plurality of discrete, spaced tabs carried by said wall means and extending into the storage pocket area and wherein each of said tabs forming said first support means terminates at the first support plane and each of said tabs forming said second support means terminates at the second support plane.

6. A tray system for storing a plurality ball grid array integrated circuit components, each integrated circuit component having a planar housing and an array of ball terminals located on one side of the housing in predetermined positions, said tray system including first and second trays each of which comprises:

A. framework means for defining a storage pocket area for each integrated circuit component, said storage pocket area being accessible from first and second opposite sides of said framework means, B. first support means carried by said framework means in each said storage pocket area for defining a first support plane for engaging the one side of the integrated circuit components when the integrated circuit component is inserted into said storage pocket area from said first side of said framework means, C. second support means carried by said framework means in each said storage pocket area for defining a second support plane that is parallel to the first support plane for engaging the other side of the integrated circuit components when the integrated circuit component is inserted into said storage pocket area from said second side of said framework means, and D. means for enabling the stacking said first and second trays whereby said first and second trays capture the integrated circuit components and said framework means in adjacent stacked strays stabilize the position of the integrated circuit component transverse to said framework means within a corresponding storage pocket area.

7. A tray system for storing integrated circuit components as recited in claim 6 wherein each of said trays has first and second complementary registration means for aligning said first and second trays in a stacked relationship.

8. A tray system for storing integrated circuit components as recited in claim 7 wherein each of said trays includes an outer peripheral section and said registration means includes complementary location means mounted to extend from opposite sides of each tray for aligning said first and second trays in the stacked relationship.

9. A tray system for storing integrated circuit components as recited in claim 7 wherein said framework means on each said tray includes a plurality of intersecting wall means for defining the limits of a storage pocket area proximate the edges of the integrated circuit components and wherein each of said wall means includes a central portion, corner extensions at each intersection of said wall means extending perpendicularly to one side of the first and second support planes and central portions located centrally of each said wall means and extending perpendicularly to other side of the first and second support planes whereby said central extensions and said corner extensions stabilize the integrated circuit component when the tray is in the first and second positions, respectively and whereby said central extensions of one of the stacked first and second trays engage with the corner extensions of the other of said stacked first and second trays.

10. A tray system for storing integrated circuit components as recited in claim 9 wherein each of said corner and central extensions include chamfered edges that cooperate during the stacking of said first and second trays for isolating said trays from contact with the ball terminals and for forming an extended wall surface about each of the integrated circuit components.

11. A tray system for storing integrated circuit components as recited in claim 6 wherein said framework means on each said tray includes a plurality of intersecting wall means for defining the limits of a storage pocket area proximate the edges of the integrated circuit components and wherein each of said wall means includes a central portion, corner extensions at each intersection of said wall means extending perpendicularly to one side of the first and second support planes and central extensions located centrally of each said wall means and extending perpendicularly to other side of the first and second support planes whereby said corner extensions and said central extensions stabilize the integrated circuit component when the tray is in the first and second positions, respectively and whereby said central extensions of one of the stacked first and second trays engage with the corner extensions of the other of said stacked first and second trays.

12. A tray system for storing integrated circuit components as recited in claim 11 wherein each of the integrated circuit components has a predetermined thickness and said first and second support means in adjacent ones of the stacked trays in each said storage pocket area establish a distance between the first and second support planes in the adjacent trays that corresponds to the thicknesses of the integrated circuit components.

13. A tray system for storing integrated circuit components as recited in claim 12 wherein each of said first and second support means comprises a plurality of discrete, spaced tabs carried by said wall means and extending into the storage pocket area.

14. A tray system for storing integrated circuit components as recited in claim 13 wherein each of said tabs extends transversely the first and second support planes and wherein each of said tabs forming said first support means terminate at the first support plane and said tabs forming said second support means terminate at the second support plane.

16. A tray system for storing integrated circuit components as recited in claim 13 wherein each of said corner and central extensions include chamfered edges that cooperate during the stacking of said first and second trays for isolating said trays from contact with the ball terminals and for forming an extended wall surface about each of the integrated circuit components for stabilizing the position of each integrated circuit component within its corresponding storage pocket area.

16. A tray system for storing integrated circuit components as recited in claim 13 wherein each of said corner extensions extends to a free edge displaced from the housing plane and each of said free edges is chamfered to facilitate placement of an integrated circuit into said storage pocket area.

17. A tray system for storing integrated circuit components as recited in claim 11 wherein each of said corner and central extensions include chamfered edges that cooperate during the stacking of said first and second trays for isolating said trays from contact with the ball terminals and for forming an extended wall surface about each of the integrated circuit components for stabilizing the position of each integrated circuit component within its corresponding storage pocket area.

18. A tray system for storing integrated circuit components as recited in claim 11 wherein each of said corner extensions extends to a free edge displaced from the housing plane and each of said free edges is chamfered to facilitate placement of an integrated circuit into said storage pocket area.

* * * * *

(12) REEXAMINATION CERTIFICATE (4255th)
United States Patent
Maston, III et al.

(10) Number: US 5,400,904 C1
(45) Certificate Issued: Jan. 16, 2001

(54) TRAY FOR BALL TERMINAL INTEGRATED CIRCUITS

(75) Inventors: Roy E. Maston, III, Amherst; Robert H. Murphy, Merrimack, both of NH (US)

(73) Assignee: R. H. Murphy Co., Inc., Amherst, NH (US)

Reexamination Request:
No. 90/005,630, Feb. 4, 2000

Reexamination Certificate for:
Patent No.: 5,400,904
Issued: Mar. 28, 1995
Appl. No.: 08/137,864
Filed: Oct. 15, 1993

(51) Int. Cl.[7] .................................................. B65D 85/90
(52) U.S. Cl. ......................... 206/725; 206/509; 206/821
(58) Field of Search ................................... 206/503, 509,
206/511, 562, 563, 565, 701, 706, 709,
719, 722–728, 821; 324/758

(56) References Cited

U.S. PATENT DOCUMENTS

| | | | |
|---|---|---|---|
| 3,615,006 | 10/1971 | Freed | 206/710 |
| 3,892,312 | 7/1975 | Tems | 206/724 |
| 4,556,145 | 12/1985 | Putnam | 206/724 |
| 4,681,221 * | 7/1987 | Chickanosky et al. | 206/724 |
| 4,718,548 | 1/1988 | Estrada et al. | 206/724 |
| 4,881,639 | 11/1989 | Matsuoka et al. | 206/724 |
| 5,080,228 | 1/1992 | Maston, III et al. | 206/724 |
| 5,103,976 | 4/1992 | Murphy | 206/725 |

FOREIGN PATENT DOCUMENTS

| | | |
|---|---|---|
| 5813317 | 8/1984 | (JP) . |
| 6231089 | 2/1987 | (JP) . |
| 290286 | 7/1990 | (JP) . |
| 419487 | 2/1992 | (JP) . |
| 291395 | 4/1992 | (JP) . |
| 5166992 | 7/1993 | (JP) . |

* cited by examiner

Primary Examiner—Jim Foster

(57) ABSTRACT

A tray for the storage and transportation of multiple ball grid array (BGA) integrated circuit components in either of two component orientations. The tray has a lattice framework that defines discrete storage pocket areas. First inwardly facing tabs on the framework define a first support plane for engaging a component is a first orientation of the tray and component. Second inwardly facing tabs on the framework define a second support plane for engaging the component in the second orientation of the tray and component. The framework includes oppositely directed central and corner extensions that stabilize the component in the housing plane in either orientation and a registration structure for allowing the plural trays to be stacked for transport in either orientation.

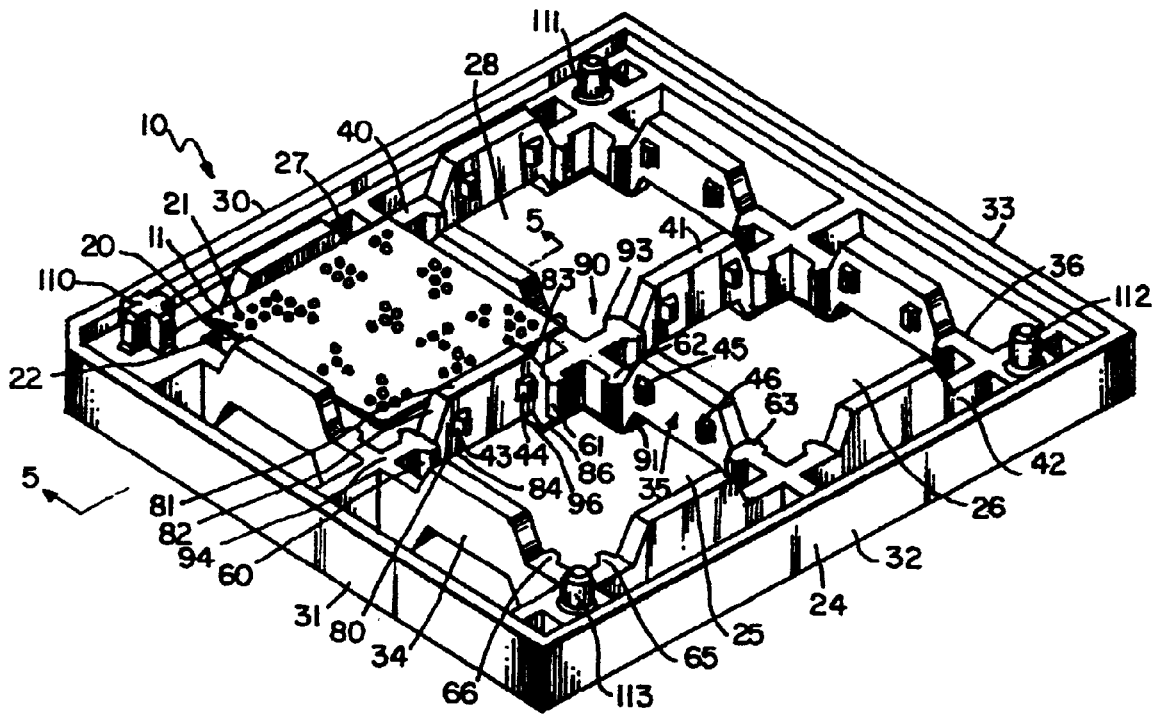

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTEDBY AMENDMENT ARE PRINTED HEREIN.

Column 5, lines 53 through column 6, line 4:

The tray 10 in FIGS. 1 through 4 is molded in a lattice-like framework 24 that segregates the tray 10 into an arbitrary number of discrete storage pocket areas. In the particular embodiment of FIG. 1, the framework comprises four storage pocket areas 25, 26, 27, and 28 that are arranged in two columns and two rows. Specifically, the tray 10 includes outer peripheral beams 30, 31, 32 and 33 that form the periphery of the tray 10. A series of intersecting walls define the storage pocket areas and include a first set of walls 34, 35 and 36 that are parallel to the beams [30] *31* and [32] *33* and a second set of spaced parallel walls 40, 41 and 42 between the beams [31] *30* and [33] *32*. The walls 34, 35 and 36 intersect the walls 40, 41 and 42. Collectively these walls form the peripheries of the various pocket storage areas. More specifically, portions of walls 34, 35, 41 and 42 form the storage pocket area 25; walls 35, 36, 41 and 42 form storage pocket area 26; walls 35, [36] *34*, 40, and 41 form storage pocket area 27; and walls 35, 36, 40 and 41 form storage pocket area 28.

Column 6, lines 28 through column 7, line 10:

Each of the walls includes additional tabs that are formed between individual ones of the first tabs and adjacent intersections of walls. Again as shown in FIGS. 1 and 3, the portion of the wall surface forming storage pocket area 25 carries inwardly extending tabs 60 and 61 while portions of the [wall] *walls* 35, [41] *42* and 34 carry, respectively, tabs 62 and 63, tabs 64 and 65 and tabs 66 and 67. Edges of corresponding tabs 70 on wall 34, 71 on wall 35 and tabs 72 and 73 on wall 40 form a second support plane 74 that, as shown in FIG. 6, engages the one planar surface 22 of the integrated circuit 11 to support the integrated circuit 11 in a terminals down position when the integrated circuit 11 is inserted in [a] *one of the* storage pocket [area] *areas* 25 through 28 from above the tray 10 in the orientation shown in FIGS. 2 and 6. These edges are the top tab edges in FIG. 6 and the bottom tab edges in FIG. 5.

Each wall portion around each storage pocket area additionally includes structures for restraining any motion of the integrated circuit 11 in a direction that is parallel to either of the first or second support planes 56 and 74, shown in FIGS. 5 and 6. The wall 41 between the storage pocket areas 25 and 27 has a central body portion 80 that extends between the walls 34 and 35. A central extension in the form of a tongue 81 carries the tabs 43 and [45] *44* that extend into the storage pocket area 25 and corresponding tabs that extend into the storage pocket area 27. The tongue 81 extends above the central portion 80 in the orientation of FIG. 1 and includes chamfered or angled surface 82 and 83 that form a transition between the upper edge of the central portion 80 and the free edge of the tongue 81. A recess 84 located below the central portion 80 has chamfered surfaces 85 and 86 and corresponds in form to the tongue 81.

Each of the wall intersections, such as the intersection 90 formed by walls 35 and 41, has a corner extension structure that extends along each wall portion into each of the adjacent storage pocket areas. In the storage pocket area 25, for example, a portion of a corner extension [92] *90* extends downwardly or oppositely from the tongue 81 at the intersection 90. A similar corner extension 92 extends along a portion of the wall 41 from the intersection of the walls 41 and 34. Each of hese corner extensions mates with a corresponding recess 93 and 94 as shown in FIGS. 1 and 3 formed by chamfered surfaces 82 and 83 thereby to facilitate the interengagement of corner extensions and tongue portions. In addition each of the corner extensions, such as corner extensions 91 and 92, [terminate] *terminates* with chamfered free edges 97 and 98 respectively. The edges facilitate the placement of components on the tray in a terminals down orientation.

Column 7, lines 32–41:

FIG. 6 depicts the structure of the stacked trays of FIG. 5 after they have been flipped to orient the integrated circuit 11 in a terminals down orientation. In this position edges of the tabs, such as tabs 106 and 107 in FIG. 10A, that correspond to tabs 72 and 73 in tray 10, support the housing 11 in a second support plane 74A corresponding to the support plane 74. The support [plane] *planes* 56 and 74A are spaced by an amount corresponding to the thickness of the integrated circuit housing 20.

AS A RESULT OF REEXAMINATION, IT HAS BEEN DETERMINED THAT:

Claims 1, 2, 6 and 15–18 are cancelled.

Claims 3–5, 7, 9, 11 and 14 are determined to be patentable as amended.

Claims 8, 10, 12 and 13, dependent on an amended claim, are determined to be patentable.

New claims 19–22 are added and determined to be patentable.

3. A tray for [an] *storing a ball grid array* integrated circuit component [as recited in claim 2] *having a planar housing, an array of terminals located on a terminal side of the housing, and a second side of the housing parallel to and spaced from the first side, the terminal and second sides defining component edges and said tray comprising;*
   A. *framework means for defining a storage pocket area and for locating the integrated circuit component in a plane transverse to said framework means, said storage pocket area being accessible from first and second opposite sides of said framework means,*
   B. *first support means carried by said framework means for defining a first support plane that is transverse to said framework means and that engages the terminal side of the integrated circuit component adjacent its periphery when the integrated circuit component is inserted into said storage pocket area from said first side of said framework means,*
   C. *second support means spaced from said first stabilizing means and carried by said framework means for defin-* ing a second support plane that is parallel to and spaced from said first support plane and that engages the other side of the integrated circuit component when the integrated circuit component is inserted into said storage pocket area from said second side of said framework means, D. first stabilizing means of said framework means at said first support means for stabilizing the position of the integrated circuit component in a plane transverse to said framework means and in said storage pocket area when the integrated circuit component has been inserted from a first side of said framework means onto said first support means whereby said tray stores the integrated circuit component in a terminals-down orientation when said tray is in a first, substantially horizontal position with the first support plane and said first stabilizing means above the second support plane, and E. second stabilizing means of said framework means at said second support means for stabilizing the position of the integrated circuit component in a plane transverse to said framework means and in said storage pocket area when the integrated circuit component has been inserted from the second side of said framework means whereby said tray stores the integrated circuit component in a terminals-up orientation when said tray is in a second, substantially horizontal position with the first support plane and said first stabilizing means below the second support plane, and wherein said first and second stabilizing means include a plurality of intersecting wall means for defining the limits of said storage pocket area with one of said first and second stabilizing means including corner extensions at each intersection of said wall means extending perpendicularly to one side of said first and second support planes and defining a central recess portion therebetween and with the other of said first and second stabilizing means including central extensions located centrally of each said wall means and extending perpendicularly to the other side of said first and second support planes and wherein each of said central and corner extensions have chamfered edges intersecting said central portion.

4. A tray for an integrated circuit component as recited in claim [2] *3* wherein at least one of said first and second support means comprises a plurality of discrete, spaced tabs carried by said wall means and extending into the storage pocket area.

5. A tray for an integrated circuit component as recited in claim [2] *3* wherein each of said first and second support means comprises a plurality of discrete, spaced tabs carried by said wall means and extending into the storage pocket area and wherein each of said tabs forming said first support means terminates at the first support plane and each of said tabs forming said second support means terminates at the second support plane.

7. A tray system for storing *a plurality of ball grid array* integrated circuit components [as recited in claim 6 wherein each of said trays has]*, each integrated circuit component having a planar housing with parallel terminal and other sides defining component edges and an array of ball terminals located on the terminal side of the housing in predetermined positions, said tray system including first and second trays each of which comprises:*

A. *framework means for defining a storage pocket area for each integrated circuit component, said storage pocket area being accessible from first and second opposite sides of said framework means,*

B. *first support means carried by said framework means in each said storage pocket area for defining a first support plane for engaging the terminal side of the integrated circuit component when the integrated circuit component is inserted into said storage pocket area from said first side of said framework means,*

C. *second support means carried by said framework means in each said storage pocket area for defining a second support plane that is parallel to the first support plane for engaging the other side of the integrated circuit component when the integrated circuit component is inserted into said storage pocket area from said second side of said framework means,*

D. *means for enabling the stacking of said first and second trays with aligned corresponding storage pocket areas,*

E. *first stabilizing means of said framework means at said first support plane for stabilizing the position of the integrated circuit component inserted from the first side of said framework means onto said first support means,*

F. *second stabilizing means of said framework means at said second support plane for stabilizing the position of the integrated circuit component inserted from the second side of said framework means onto said second support means whereby said first and second trays in the tray system capture the integrated circuit component therebetween and said first and second stabilizing means of said stacked first and second trays interengage to stabilize the position of the integrated circuit component transverse to said framework means within said storage pocket area, and*

G. first and second complementary registration means for aligning said first and second trays in [a] *the* stacked relationship.

9. A tray system for storing integrated circuit components as recited in claim 7 wherein [said framework means on each said tray includes a plurality of intersecting wall means for defining the limits of a storage pocket area proximate the edges of the integrated circuit components and wherein each of said wall means includes a central portion,] *said stabilizing means include a plurality of intersecting wall means for defining the limits of said storage pocket area wherein said wall means include* corner extensions at each intersection of said wall means extending perpendicularly to one side of the first and second support planes and *defining a central recess therebetween and* central [portions] *extensions* located centrally of each said wall means and extending perpendicularly to other side of the first and second support planes [whereby said central extensions and said corner extensions stabilize the integrated circuit component when the tray is in the first and second positions, respectively and] whereby said central extensions of one of the stacked first and second trays [engage] *interengage* with the corner extensions of the other of said stacked first and second trays.

11. A tray system for storing *a plurality of ball grid array* integrated circuit components [as recited in claim 6]*, each integrated circuit component having a planar housing with parallel terminal and other sides defining component edges and an array of ball terminals located on the terminal side of the housing in predetermined positions, said tray system including first and second trays each of which comprises:*

A. *framework means for defining a storage pocket area for each integrated circuit component, said storage pocket area being accessible from first and second opposite sides of said framework means,*

B. first support means carried by said framework means in each said storage pocket area for defining a first support plane for engaging the terminal side of the integrated circuit component when the integrated circuit component is inserted into said storage pocket area from said first side of said framework means, C. second support means carried by said framework means in each said storage pocket area for defining a second support plane that is parallel to the first support plane for engaging the other side of the integrated circuit component when the integrated circuit component is inserted into said storage pocket area from said second side of said framework means, D. means for enabling the stacking of said first and second trays with aligned corresponding storage pocket areas, E. first stabilizing means formed with said framework means at said first support plane for stabilizing the position of the integrated circuit component inserted from the first side of said framework means onto said first support means, and F. second stabilizing means formed with said framework means at said second support plane for stabilizing the position of the integrated circuit component inserted from the second side of said framework means onto said second support means whereby said first and second trays in the tray system capture the integrated circuit component therebetween and wherein said [framework] *first and second stabilizing* means on each said [tray includes] *stacked first and second trays interengage* to stabilize the position of the integrated circuit component transverse to said framework means within said corresponding storage pocket area and wherein said first and second stabilizing means include a plurality of intersecting walls means for defining the limits of a storage pocket area [proximate the edges of the integrated circuit components] and wherein [each of said wall means includes a central portion,] *one of said first and second stabilizing means includes* corner extensions at each intersection of said wall means extending perpendicularly to one side of the first and second support planes and *central recesses between said corner extensions and the other of said first and second stabilizing means includes* central extensions located centrally of each said wall means and extending perpendicularly to *the* other side of the first and second support planes whereby said corner extensions and said central extensions stabilize the integrated circuit component [when the tray is in the first and second positions, respectively] and whereby said central extensions of one of the stacked first and second trays [engage] *are adapted to be received in said central recesses of the other tray to interengage* with the corner extensions of the other of said stacked first and second trays.

14. A tray system for storing integrated circuit components as recited in claim 13 [wherein each of said tabs extends transversely the first and second support planes and] wherein each of said tabs forming said first support means [terminate] *terminates* at the first support plane and said tabs forming said second support means terminate at the second support plane.

19. A tray system for storing integrated circuit components as recited in claim 13 wherein each of said corner and central extensions include chamfered edges that cooperate during the stacking of said first and second trays for isolating said trays from contact with the ball terminals and for forming an extended wall surface about each of the integrated circuit components for stabilizing the position of each integrated circuit component within its corresponding storage pocket area.

20. A tray system for storing integrated circuit components as recited in claim 13 wherein each of said corner extensions extends to a free edge displaced from the housing plane and each of said free edges is chamfered to facilitate placement of an integrated circuit into said storage pocket area.

21. A tray system for storing integrated circuit components as recited in claim 11 wherein each of said corner and central extensions include chamfered edges that cooperate during the stacking of said first and second trays for isolating said trays from contact with the ball terminals and for forming an extended wall surface about each of the integrated circuit components for stabilizing the position of each integrated circuit component within its corresponding storage pocket area.

22. A tray system for storing integrated circuit components as recited in claim 11 wherein each of said corner extensions extends to a free edge displaced from the housing plane and each of said free edges is chamfered to facilitate placement of an integrated circuit into said storage pocket area.

\* \* \* \* \*